(12) United States Patent
Ito

(10) Patent No.: US 9,881,824 B2
(45) Date of Patent: Jan. 30, 2018

(54) TRANSFER APPARATUS AND CONTROL METHOD THEREOF

(71) Applicant: Murata Machinery, Ltd., Kyoto-shi, Kyoyo (JP)

(72) Inventor: Junichi Ito, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 0 days.

(21) Appl. No.: 15/109,785

(22) PCT Filed: Oct. 29, 2014

(86) PCT No.: PCT/JP2014/078748
§ 371 (c)(1),
(2) Date: Jul. 5, 2016

(87) PCT Pub. No.: WO2015/104887
PCT Pub. Date: Jul. 16, 2015

(65) Prior Publication Data
US 2016/0329226 A1 Nov. 10, 2016

(30) Foreign Application Priority Data
Jan. 7, 2014 (JP) ................. 2014-000964

(51) Int. Cl.
*H01L 21/677* (2006.01)
*H01L 21/687* (2006.01)
*B66C 13/18* (2006.01)

(52) U.S. Cl.
CPC ........ *H01L 21/67733* (2013.01); *B66C 13/18* (2013.01); *H01L 21/6773* (2013.01); *H01L 21/68707* (2013.01)

(58) Field of Classification Search
CPC .......... H01L 21/67733; H01L 21/6773; H01L 21/68707; B65G 47/50; Y10T 156/1339; Y10T 156/1771; B66C 13/18
(Continued)

(56) References Cited

U.S. PATENT DOCUMENTS

RE19,805 E * 1/1936 Ellis, Jr. .................... B66B 1/52
187/389
2,723,393 A * 11/1955 Verrinder .................. B27F 7/02
227/100
(Continued)

FOREIGN PATENT DOCUMENTS

WO 2011/148459 A1 12/2011

OTHER PUBLICATIONS

English language translation of International Search Report dated Feb. 3, 2015 issued in corresponding PCT application PCT/JP2014/078748.

*Primary Examiner* — Rita Leykin
(74) *Attorney, Agent, or Firm* — DLA Piper LLP (US)

(57) ABSTRACT

A transfer apparatus that includes a moving unit capable of moving with respect to a base and transferring an article with the moving unit protruding from the base. The transfer apparatus includes a movement regulation unit capable of switching between a first state in which the moving unit is restricted in a reference position and a second state in which the moving unit is allowed to move from the reference position to one of a first direction and a second direction opposite to the first direction and in which movement of the moving unit in the other direction is restricted.

8 Claims, 7 Drawing Sheets

(58) Field of Classification Search
USPC .................................................. 318/568.12
See application file for complete search history.

(56) References Cited

U.S. PATENT DOCUMENTS

| | | | | | |
|---|---|---|---|---|---|
| 3,191,745 | A | * | 6/1965 | Karcher, Jr. | B65G 47/50 198/346 |
| 3,451,874 | A | * | 6/1969 | Solomon | B65C 9/1819 156/354 |
| 3,483,829 | A | * | 12/1969 | Barry | B60K 1/00 104/18 |
| 5,103,686 | A | * | 4/1992 | Rosenquist | E04H 6/182 74/89.2 |
| 5,460,475 | A | * | 10/1995 | Lloyd | B65G 1/0407 414/282 |
| 7,461,598 | B2 | * | 12/2008 | Shiwaku | B61B 1/00 104/87 |
| 7,516,859 | B2 | * | 4/2009 | Taniguchi | B65G 1/0435 212/331 |
| 7,578,240 | B2 | * | 8/2009 | Shiwaku | H01L 21/67715 104/88.01 |
| 7,578,650 | B2 | * | 8/2009 | Aalund | H01L 21/67775 414/217 |
| 7,581,502 | B2 | * | 9/2009 | Nakao | E01B 25/12 104/106 |
| 7,735,424 | B2 | * | 6/2010 | Nakashima | B65G 1/0457 104/89 |
| 7,780,020 | B2 | * | 8/2010 | Yoshitaka | B65G 37/02 212/332 |
| 7,789,019 | B2 | * | 9/2010 | Kato | B61B 3/02 104/111 |
| 7,845,284 | B2 | * | 12/2010 | Izumi | B65G 17/20 104/88.02 |
| 7,891,929 | B2 | * | 2/2011 | Yamamoto | B65G 47/5104 414/281 |
| 8,047,762 | B2 | * | 11/2011 | Zimmerhackl | H01L 21/67276 414/222.07 |
| 8,206,077 | B2 | * | 6/2012 | Ishikawa | B65G 37/02 212/332 |
| 8,287,222 | B2 | * | 10/2012 | Sawado | H01L 21/67724 414/279 |
| 8,382,417 | B2 | * | 2/2013 | Yoshida | B65G 37/02 414/222.04 |
| 8,550,006 | B2 | * | 10/2013 | Wada | H01L 21/67766 104/89 |
| 8,689,444 | B2 | * | 4/2014 | Sueoka | F01L 1/20 123/90.25 |
| 8,701,864 | B2 | * | 4/2014 | Ogawa | B65G 35/06 104/91 |
| 8,726,811 | B2 | * | 5/2014 | Kobayashi | H01L 21/67733 104/89 |
| 8,892,278 | B2 | * | 11/2014 | Lin | H01L 21/67733 104/124 |
| 8,926,251 | B2 | * | 1/2015 | Iizuka | H01L 21/67389 414/217 |
| 8,939,698 | B2 | * | 1/2015 | Izumi | H01L 21/67766 414/591 |
| 8,948,908 | B2 | * | 2/2015 | Nomura | H01L 21/67766 211/41.18 |
| 9,004,840 | B2 | * | 4/2015 | Kinugawa | H01L 21/67733 414/281 |
| 9,073,691 | B2 | * | 7/2015 | Morimoto | H01L 21/67733 |
| 9,117,853 | B2 | * | 8/2015 | Tsubaki | H01L 21/67259 |
| 9,168,930 | B2 | * | 10/2015 | Wada | B61B 3/02 |
| 2004/0154493 | A1 | * | 8/2004 | Faucher | A61G 7/1015 104/89 |
| 2006/0194445 | A1 | * | 8/2006 | Hayashi | H01L 21/67017 438/758 |
| 2006/0222479 | A1 | * | 10/2006 | Shiwaku | B65G 1/0457 414/267 |
| 2008/0075564 | A1 | * | 3/2008 | Tachibana | H01L 21/67733 414/217 |
| 2010/0204826 | A1 | * | 8/2010 | Sawado | H01L 21/67766 700/228 |
| 2013/0197691 | A1 | | 8/2013 | Tsubaki et al. | |

* cited by examiner (a)

(b)

TRANSFER APPARATUS AND CONTROL METHOD THEREOF

CROSS REFERENCE TO RELATED APPLICATIONS

This application is a national stage of international application no. PCT/JP2014/078748, filed on Oct. 29, 2014, and claims the benefit of priority under 35 USC 119 of Japanese application no. 2014-000964, filed on Jan. 7, 2014, both of which are incorporated herein by reference in their entirety.

TECHNICAL FIELD

The present invention relates to a transfer apparatus and control method thereof.

BACKGROUND ART

There is known a configuration in which a transfer apparatus for transferring articles is connected to a ceiling traveling vehicle that travels a track installed on the ceiling. This transfer apparatus includes a main body connected to the ceiling traveling vehicle and a moving unit capable of moving to a side of the main body in the traveling direction of the ceiling traveling vehicle. The transfer apparatus is configured to move the moving unit using a drive mechanism, such as a belt mechanism or gear mechanism, so that the moving unit protrudes from a side of the main body and to transfer an article in this state. After transferring the article, the transfer apparatus returns the moving unit to the main body using the drive mechanism.

If the belt is cut or the gear is disengaged in this transfer apparatus, the moving unit may inadvertently rush out to the other side of the maim body and interfere with an adjacent structure, such as another ceiling traveling vehicle or column. To prevent such inadvertent rush-out of a moving unit, there have been proposed engaging apparatuses that, when a ceiling traveling vehicle is traveling, engage a moving unit with a main body and, when the ceiling traveling vehicle is stopped in order to transfer an article, disengage the moving unit from the main body in order to move the moving unit to a side of the main body, for example, as shown in Patent Literature 1.

CITATION LIST

Patent Literature

[Patent Literature 1] International Publication No. 2011/148459

SUMMARY OF INVENTION

Technical Problem

However, with regard to the above configuration, if the belt is cut or the gear is disengaged, for example, when the moving unit is returning to the main body after moving to the side of the main body, the moving unit may rush out to the other side and interfere with another ceiling traveling vehicle.

In view of the foregoing, an object of the present invention is to provide a transfer apparatus and control method thereof that can reliably prevent inadvertent rush-out of a moving unit.

Solution to Problem

The present invention provides a transfer apparatus that includes a moving unit capable of moving with respect to a main body and transferring an article with the moving unit protruding from the main body. The transfer apparatus includes a movement regulation unit configured to be capable of switching between a first state in which the moving unit is restricted in a reference position and a second state in which the moving unit is allowed to move from the reference position to one of a first direction and a second direction opposite to the first direction and in which movement of the moving unit in the other direction is restricted.

The movement regulation unit may be formed so as to be capable of switching among the first state and the second state, as well as a third state in which the moving unit is allowed to move in the first direction and the second direction only in a predetermined range. The movement regulation unit may include a rotor including a stopper, the stopper being configured to contact an engaging part in a moving direction of the engaging part, the engaging part being disposed on the moving unit, and the movement regulation unit may switch between at least the first state and the second state on the basis of a rotation position of the rotor. The rotor may include an outer stopper disposed outside the stopper and configured to allow the engaging part to move only in a predetermined range. The movement regulation unit may include an indication unit configured to rotate with rotation of the rotor, a sensor unit configured to detect the indication unit, and a controller configured to control the rotation position of the rotor on the basis of a detection result from the sensor unit. The sensor unit may include multiple sensor units disposed along a rotation direction of the indication unit, and the controller may control the rotation position of the rotor on the basis of detection results from the sensor units. The main body may be connected to a ceiling traveling vehicle, and the moving unit may include a gripper capable of holding an article and an ascent/descent drive unit configured to raise and lower the gripper. The first direction and the second direction may be directions crossing a traveling direction of the ceiling traveling vehicle, of horizontal directions.

The present invention also provides a method for controlling a transfer apparatus, the transfer apparatus including a moving unit capable of moving with respect to a main body and configured to transfer an article with the moving unit protruding from the main body. The method includes switching, by a movement regulation unit, between a first state in which the moving unit is regulated in a reference position and a second state in which the moving unit is allowed to move from the reference position to one of a first direction and a second direction opposite to the first direction and in which movement of the moving unit in the other direction is regulated.

Advantageous Effects of the Invention

According to the present invention, the movement regulation unit can switch between the first state, in which the transfer unit is regulated in the reference position, and the second state, in which the transfer unit is allowed to move from the reference position to one of the first direction and second direction and in which the movement of the transfer unit in the other direction is regulated. Thus, in a case in which the transfer unit is moved in the first direction and then moved in the second direction to order to return it to the reference position, the movement regulation unit prevents the moving unit from rushing out in the second direction. As a result, inadvertent rush-out of the moving unit is reliably prevented.

Further, the movement regulation unit may be formed so as to be capable of switching among the first state and the second state, as well as the third state, in which the moving unit is allowed to move in the first direction and the second direction only in the predetermined range. In this case, when the movement regulation unit is in the third state, the position of the moving unit can be fine-adjusted in the predetermined range. Further, the movement regulation unit may include a rotor including a stopper, the stopper contacting an engaging part in a moving direction of the engaging part, the engaging part being disposed on the moving unit, and the movement regulation unit may switch between at least the first state and the second state on the basis of a rotation position of the rotor. In this case, by simply rotating the rotor, the movement regulation unit can easily switch between at least the first state and the second state. Further, the rotor may include an outer stopper disposed outside the stopper and configured to allow the engaging part to move only in a predetermined range. In this case, the outer stopper can regulate the movement of the engaging part. Further, the movement regulation unit may include an indication unit configured to rotate with rotation of the rotor, a sensor unit configured to detect the indication unit, and a controller configured to control the rotation position of the rotor on the basis of a detection result from the sensor unit. In this case, the movement regulation unit can automatically perform switching. Further, the sensor unit may include multiple sensor units disposed along a rotation direction of the indication unit, and the controller may control the rotation position of the rotor on the basis of detection results from the sensor units. In this case, the sensor unit and the controller can reliably control the rotation position of the rotor. Further, the main body may be connected to a ceiling traveling vehicle, and the moving unit may include a gripper capable of holding an article and an ascent/descent drive unit configured to raise and lower the gripper. Thus, inadvertent rush-out of the moving unit can be reliably prevented in any of a case in which the ceiling traveling vehicle is traveling, a case in which the moving unit is moving to a side of the main body, a case in which the moving unit is raising or lowering the gripper, and a case in which the moving unit is returning to the main body. Further, the first direction and the second direction may be directions crossing a traveling direction of the ceiling traveling vehicle, of horizontal directions. In this case, it is possible to prevent the moving unit from inadvertently rushing out in a direction crossing the traveling direction of the ceiling traveling vehicle. Thus, when ceiling traveling vehicles are traveling tracks extending in parallel, it is possible to prevent the vehicles from interfering with each other.

DESCRIPTION OF EMBODIMENTS

Figure 1:
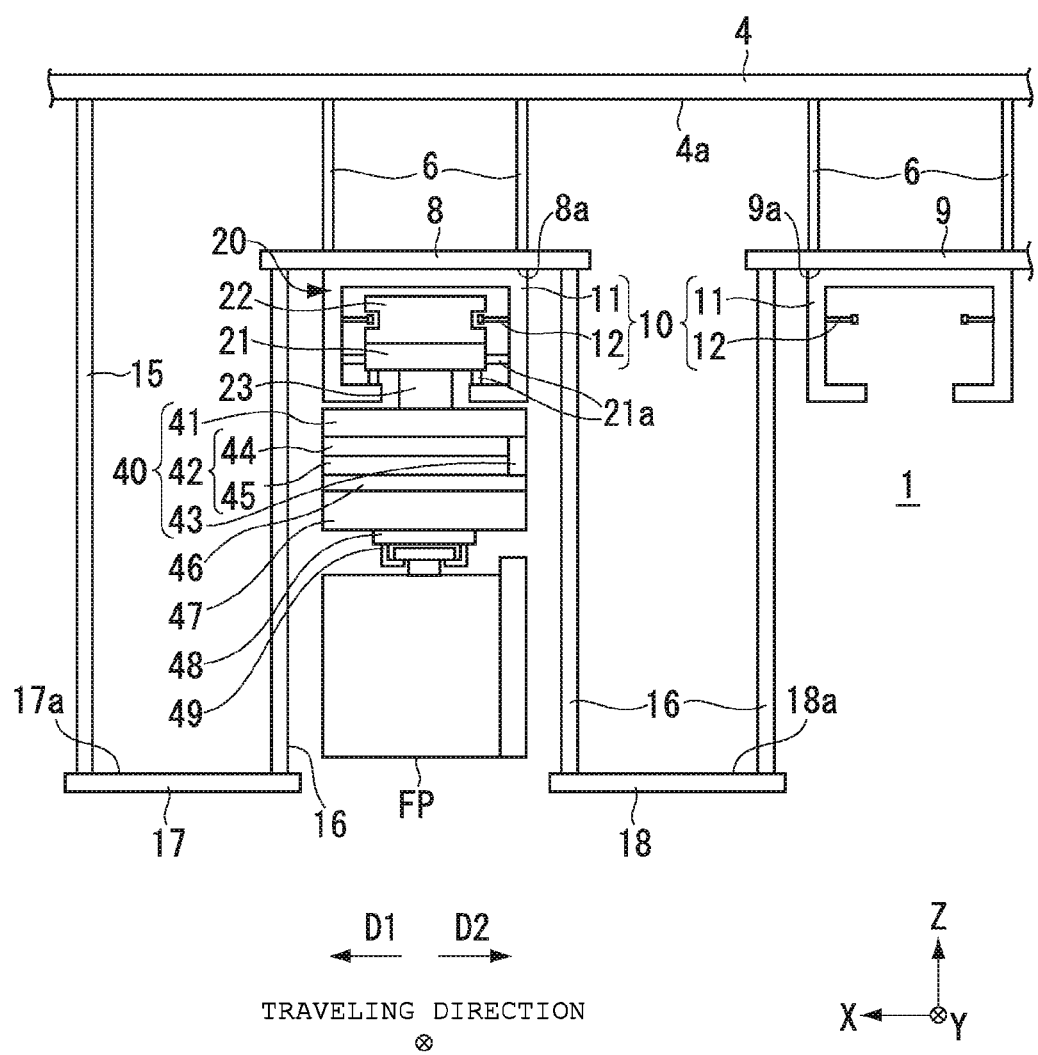
FIG. 1 is a diagram showing an example of the ceiling and its vicinity of a processing chamber.

Now, an embodiment of the present invention will be described with reference to the drawings. However, the present invention is not limited thereto. To clarify the embodiment, the drawings are scaled, for example, partially enlarged or highlighted, as necessary. In the drawings, directions will be shown by an XYZ coordinate system. A plane parallel with the horizontal plane in the XYZ coordinate system is referred to as an XY-plane. The travelling direction of a ceiling travelling vehicle 20 in the XY-plane is referred to as a Y-direction, and a direction perpendicular to the Y-direction is referred to as an X-direction. A direction perpendicular to the XY-plane is referred to as a Z-direction. In the drawings, directions shown by arrows are the positive directions of the X-, Y-, and Z-directions, and the opposite directions are the negative directions thereof. The direction of rotation around the X-axis is referred to as a $\theta$X-direction; the direction of rotation around the Y-axis as a $\theta$Y-direction; and the direction of rotation around the Z-axis as a $\theta$Z-direction.

FIG. 1 is a diagram showing an example of the ceiling and its vicinity of a processing chamber 1. The processing chamber 1 is installed, for example, in a clean room and is provided with a semiconductor processing device (not shown) or the like.

The ceiling of the processing chamber 1 is provided with a ceiling member 4, first columns 6, and a second column 15. The ceiling member 4 has a ceiling surface 4a. The ceiling surface 4a is formed in parallel with a horizontal plane. The first columns 6 are fixed to the ceiling member 4 and extend from the ceiling surface 4a in the downward direction (the negative Z-direction).

The first columns 6 have first support members 8, 9 fixed to negative Z-side ends thereof. The first support members 8, 9 are formed so that the length direction thereof is the Y-direction. The first support members 8, 9 are fixed to the ceiling member 4 through the first columns 6. The negative Z-side surfaces (support surfaces) 8a, 9a of the first support members 8, 9 are disposed in parallel with the ceiling surface 4a.

Rails 10 are disposed adjacent to each other on the support surfaces 8a, 9a. The rails 10 are tracks for guiding the ceiling travelling vehicle 20. Each rail 10 includes a travelling rail 11 and a power supply rail 12. At least part of each rail 10 is disposed, for example, along the longitudinal direction (Y-direction) of the first support member 8 or 9. The adjacent rails 10 are disposed in parallel. Note that in FIG. 1, a ceiling travelling vehicle disposed on the rail 10 under the support member 9 is not shown.

The ceiling travelling vehicle 20 is disposed inside the travelling rail 11. The ceiling travelling vehicle 20 travels along the rail 10 in the positive Y-direction. The ceiling travelling vehicle 20 includes a traveling drive unit 21, a power receiving unit 22, and a connector 23. The traveling drive unit 21 includes multiple rollers 21a in contact with the inner surface of the travelling rail 11 and a drive unit (not shown) that rotates the rollers 21a. The power receiving unit 22 receives power through a non-contact power supply line disposed on the power supply rail 12 and supplies power to the traveling drive unit 21 and the like. The connector 23 is mounted on the negative Z-side of the traveling drive unit 21 and connects the traveling drive unit 21 and a transfer apparatus 40.

The transfer apparatus 40 includes a base (main body) 41, a moving unit 42, and a movement regulation unit 43. The base 41 is connected to the ceiling travelling vehicle 20 (the traveling drive unit 21) through the connector 23. Accordingly, the base 41 can move integrally with the ceiling travelling vehicle 20.

The moving unit 42 includes a middle part 44 and a top part 45. The middle part 44 is mounted on the base 41. The middle part 44 moves along a guide (not shown) in first and second directions D1 and D2 which are along the X-direction. The top part 45 is mounted on the middle part 44. With the movement of the middle part 44, the top part 45 can move in the first and second directions D1 and D2, which are along the X-direction.

Disposed under (the negative Z-side) the top part 45 is a turning unit 46, an ascent/descent drive unit 47, a platform 48, and a gripper 49. The turning unit 46 turns the ascent/descent drive unit 47 and lower elements (the platform 48 and gripper 49) in the θZ-direction with respect to the top part 45.

The ascent/descent drive unit 47 controls the ascent and descent (the Z-direction movement) of the platform 48. The ascent/descent drive unit 47 is connected to the platform through a belt 48a (see FIG. 3) formed with a predetermined length. The ascent/descent drive unit 47 is provided with a drum (not shown) around which the belt 48a is wound. The ascent/descent drive unit 47 moves the platform 48 in the Z-direction by winding or unwinding the belt 48a.

Driven by the ascent/descent drive unit 47, the platform 48 moves integrally with the gripper 49 in the Z-direction. The gripper 49 includes a pair of nails 49a. The nails 49a can grasp an article FP, such as a front opening unified pod (FOUP) for semiconductor wafers. In the present embodiment, the pair of nails 49a are grasping a protrusion FPa on the positive Z-side surface of the article FP.

The first support members 8, 9 have third columns 16 disposed on the support surfaces 8a, 9a thereof. The third columns 16 are disposed in positions sandwiching the rails 10 in the X-direction. The third columns 16 extend in the negative Z-direction. The third columns 16 have second support members 17, 18 fixed to the ends thereof in the negative Z-direction. The second support member 17 is disposed on the positive X-side of the first support member 8, and the second support member 18 is disposed on the negative X-side of the first support member 8. The second support members 17, 18 have placement surfaces 17a, 18a, respectively. The placement surfaces 17a, 18a are formed in parallel with the horizontal plane. The second support members 17, 18 are formed in such a manner that articles or the like can be temporarily placed on the placement surfaces 17a, 18a, and are used as buffers.

The second support member 17 is supported by the third column 16 disposed on the negative X-side and the second column 15. The second column 15 extends from the ceiling surface 4a in the negative Z-direction and is fixed to the second support member 17 at the negative Z-side end thereof. The second support member 18 is supported by the negative X-side column of the third columns 16 disposed on the first support member 8 and the positive X-side column of the third columns 16 disposed on the first support member 9.

Instead of the second support members 17, 18, an appropriate automatic warehouse, cabinet, or the like may be disposed. Note that any of the support member 9, and the rail 10, ceiling travelling vehicle 20, and the like under the support member 9 need not be disposed. The second support member 18 need not be disposed either.

Figure 2:
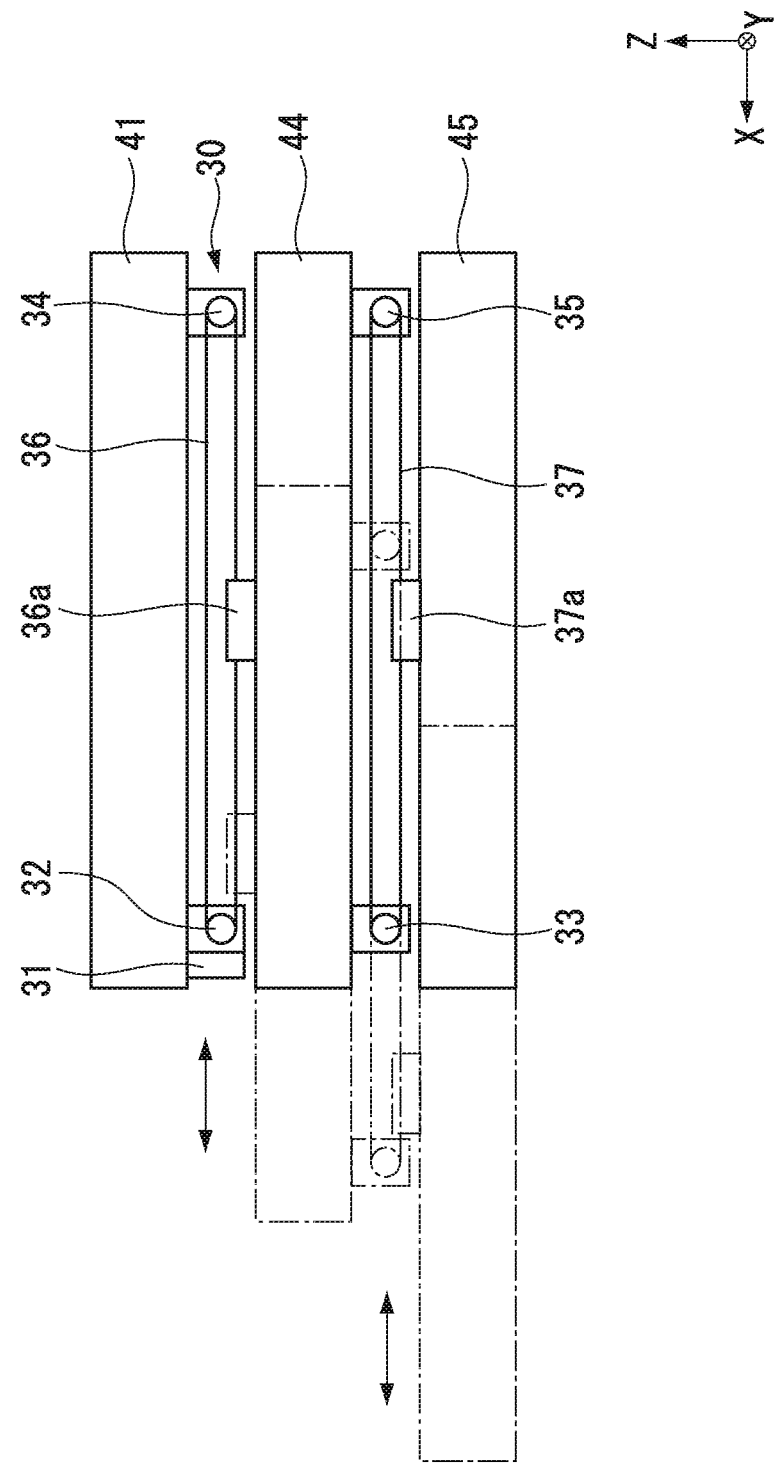
FIG. 2 is a diagram showing an example of a belt mechanism.

FIG. 2 is a diagram schematically showing an example of the base 41 and a belt mechanism 30 that drives the moving unit 42. Note that the belt mechanism 30 is not limited to the configuration shown in FIG. 2.

As shown in FIG. 2, the middle part 44 and top part 45 are driven by the belt mechanism 30. The belt mechanism 30 includes a drive motor 31, drive pulleys 32, 33, driven pulleys 34, 35, and drive belts 36, 37. The drive motor 31, drive pulley 32, and driven pulley 34 are fixed to the negative Z-side of the base 41. The drive pulley 32 is rotated by the driving power of the drive motor 31. The drive belt 36 is hung on the drive pulley 32 and driven pulley 34 and includes a fixing part 36a. The fixing part 36a is fixed to the middle part 44.

The drive pulley 33 and driven pulley 35 are fixed to the negative Z-side of the middle part 44. The drive pulley 33 is connected to the drive motor 31 or drive pulley 32 through a rotation force transmission mechanism (not shown). The drive pulley 33 rotates in synchronization with the rotation of the drive pulley 32. The drive belt 37 is hung on the drive pulley 33 and driven pulley 35 and includes a fixing part 37a. The fixing part 37a is fixed to the top part 45.

In the belt mechanism 30, the rotation of the drive motor 31 rotates the drive pulleys 32, 33, which then rotate the drive belts 36, 37. Due to the rotation of the drive belt 36, the middle part 44 moves so as to protrude to the positive X-side or negative X-side (in the case of FIG. 2, the positive X-side) of the base 41. Also, due to the rotation of the drive belt 37, the top part 45 moves so as to protrude to the positive X-side or negative X-side (in the case of FIG. 2, the positive X-side) of the middle part 44.

Figure 3:
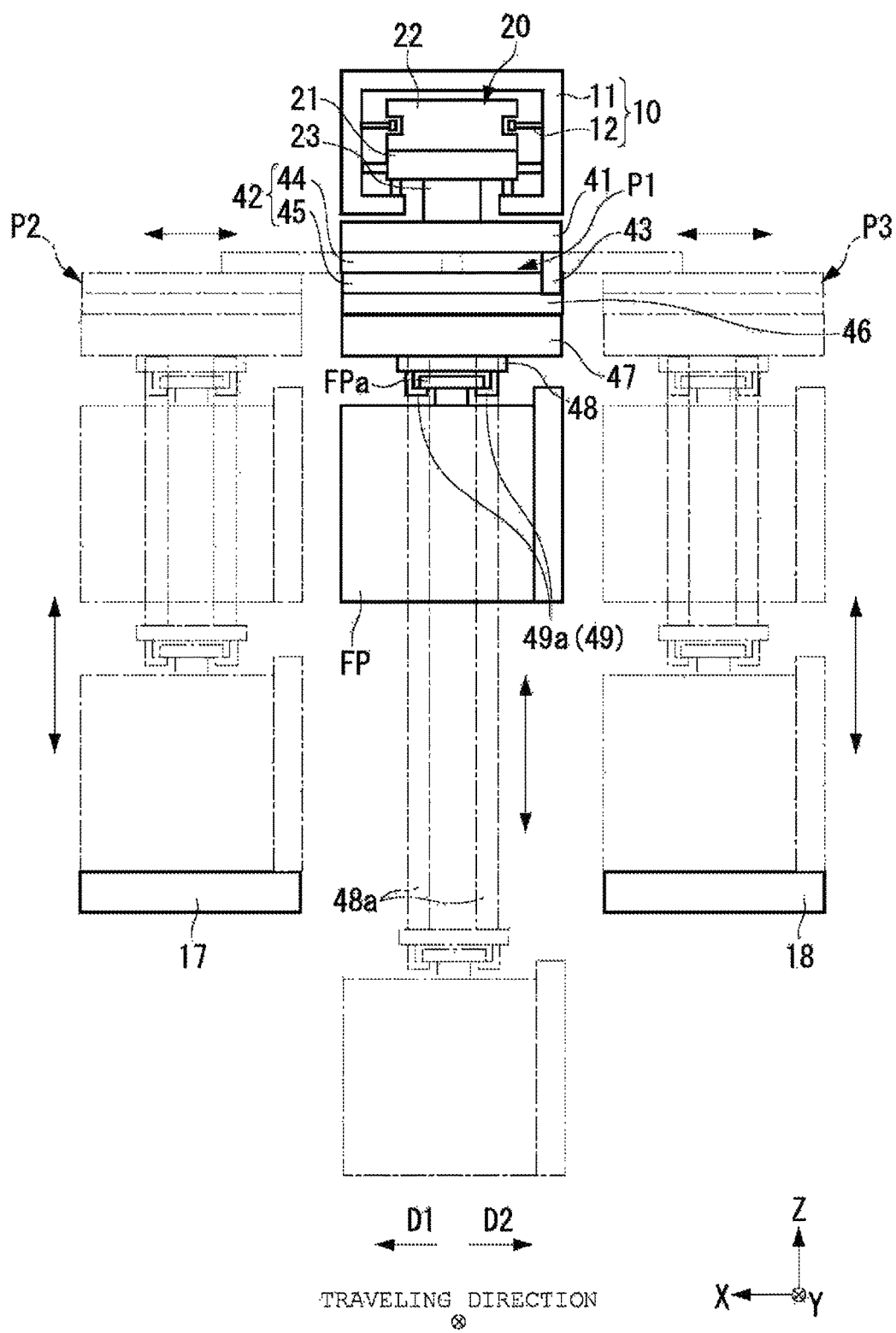
FIG. 3 is a diagram showing an example of the operating state of a transfer apparatus.

FIG. 3 is a diagram showing an example of the operating state of the transfer apparatus 40.

When the moving unit 42 rushes out to the positive X-side or negative X-side of the rail 10 during the traveling of the ceiling travelling vehicle 20, the moving unit 42 may interfere with an adjacent structure, whether the gripper 49 is grasping the article FP or not. For this reason, during the traveling of the ceiling travelling vehicle 20, the transfer apparatus 40 keeps the moving unit 42 in a state in which the moving unit 42 is located in a predetermined reference position P1 (a first state), without moving the moving unit 42 to the positive X-side or negative X-side, as shown in FIG. 3. In the first state, the reference position P1 is the position of the moving unit 42 during the traveling of the ceiling travelling vehicle 20. While, in the present embodiment, the reference position P1 is a position in which the base 41 and moving unit 42 (the middle part 44 and top part 45) overlap each other when seen in the Z-direction, it may be other positions.

On the other hand, in order to place the article FP grasped by the gripper 49 on the second support member 17 or 18 or in order to grasp the article FP on the second support member 17 or 18 with the gripper 49, the ceiling travelling vehicle 20 is stopped. Then, the transfer apparatus 40 places the top part 45 of the moving unit 42 in a state in which the top part 45 has been moved to a protruding position P2 in the first direction D1 or a protruding position P3 in the second direction D2 (a second state). The protruding position P2 is located in the positive Z-direction of the second support member 17. The protruding position P3 is located in the positive Z-direction of the second support member 18. As shown by dot-and-dash lines in FIG. 3, by advancing the belt 48a in the second state, the platform 48 and gripper 49 can be lowered. Thus, when the gripper 49 is grasping the article FP, it can place the article FP, for example, on the second support member 17 or 18; when the gripper 49 is not grasping the article FP but rather the article FP is placed on the second support member 17 or 18, the gripper 49 can grasp the article FP on the second support member 17 or 18.

Further, in order to place the article FP grasped by the gripper 49 on a predetermined position of a device or the like disposed below the rail 10 or in order to grasp the article FP placed in a predetermined position of a device or the like disposed below the rail 10 with the gripper 49, the ceiling travelling vehicle 20 is stopped. Then, the transfer apparatus 40 places the platform 48 in a state in which the platform 48 has moved in the negative Z-direction (a third state), without moving the moving unit 42 to the protruding position P2 or protruding position P3. In the third state, the positional relationship between the gripper 49 and the article FP is fine-adjusted. Thus, the moving unit 42 can be moved only in a predetermined range in the X-direction.

Figure 4:
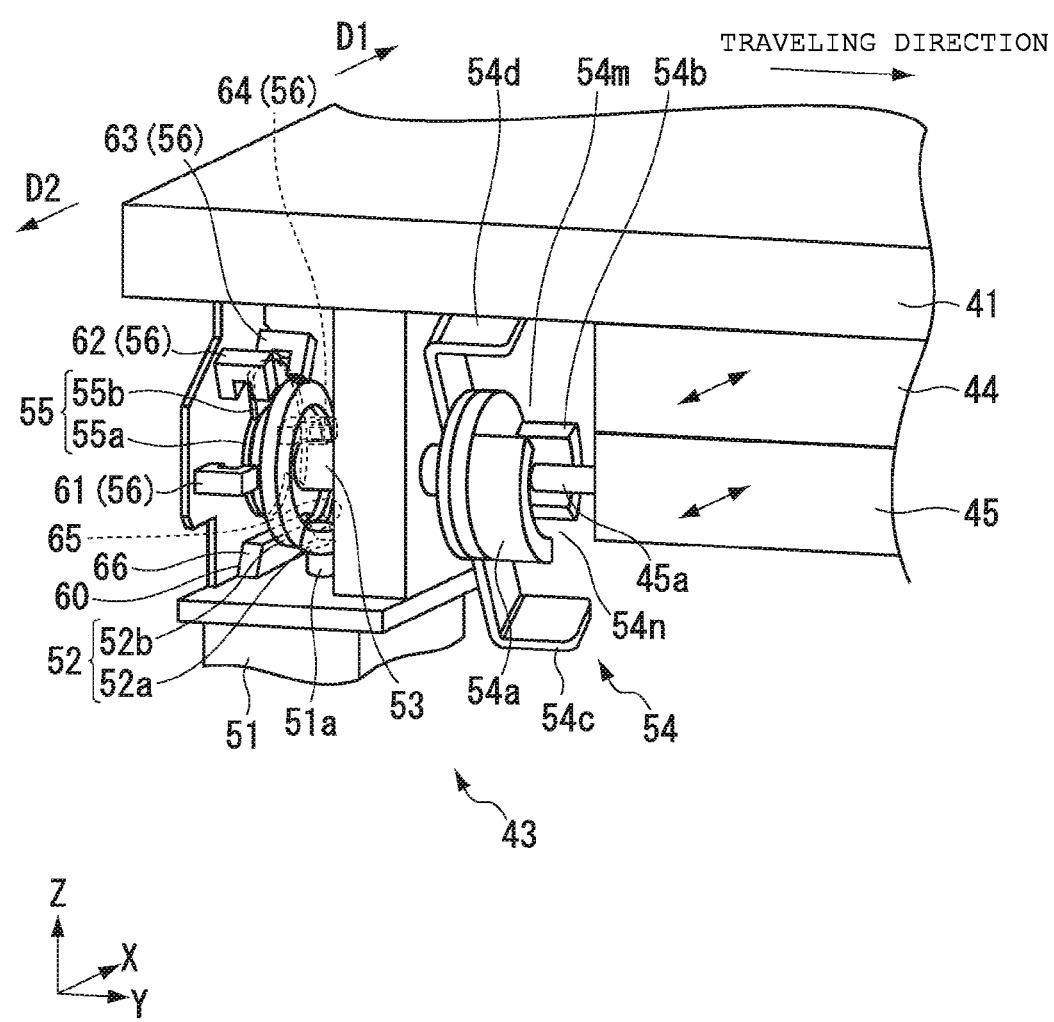
FIG. 4 is a perspective view showing an example of a movement regulation unit.
Figure 5:
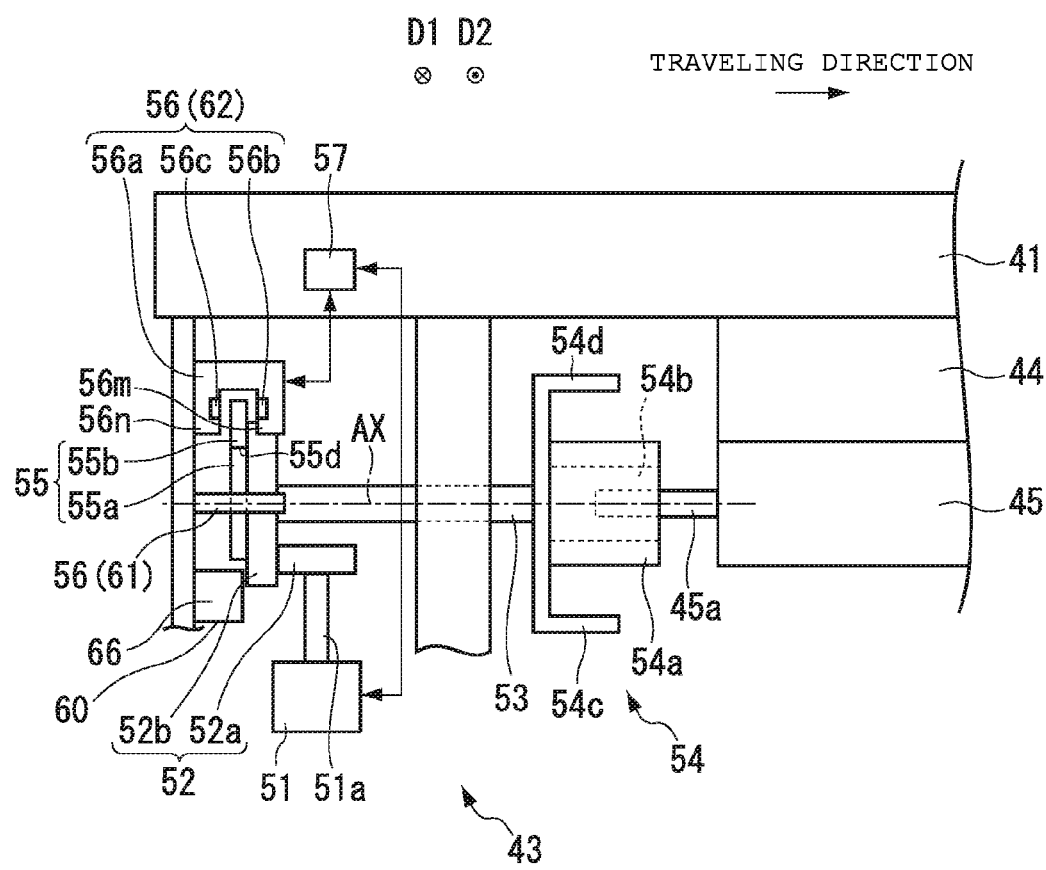
FIG. 5 is a side view showing an example of the movement regulation unit.

FIG. 4 is a perspective view showing an example of the movement regulation unit 43. FIG. 5 is a side view showing an example of the movement regulation unit 43.

As shown in FIGS. 4 and 5, the movement regulation unit 43 includes a drive source 51, a rotation transmission gear 52, a rotation shaft 53, a rotor 54, an indication unit 55, a sensor unit 56, a controller 57, and a mechanical stopper 60.

The drive source 51 is, for example, a motor and includes an output shaft 51a that outputs rotation. The drive source 51 rotates the output shaft 51a in the θZ-direction. The rotation transmission gear 52 includes a first gear 52a and a second gear 52b. The first gear 52a is fixed to the output shaft 51a of the drive source 51. The second gear 52b is engaged with the first gear 52a and converts the rotation of the first gear 52a in the θZ-direction into rotation in the θY-direction. The rotation shaft 53 is fixed to the second gear 52b. With the rotation of the second gear 52b, the rotation shaft 53 rotates in a direction (θY-direction) around a rotation center axis AX which is along the Y-direction. The rotor 54 is disposed integrally with the rotation shaft 53. The rotation of the rotation shaft 53 rotates the rotor 54 in a direction (θY-direction) around the rotation center axis AX.

The rotor 54 is fixed in such a manner that the positions thereof in the X-direction, Y-direction, and Z-direction are not changed. The rotor 54 includes a first stopper (stopper) 54a, a second stopper (stopper) 54b, a third stopper (outer stopper) 54c, and a fourth stopper (outer stopper) 54d.

The first stopper 54a and the second stopper 54b are both formed along a cylindrical surface around the rotation center axis AX of the rotor 54. Gaps 54m, 54n are formed between the first stopper 54a and second stopper 54b. The third stopper 54c and fourth stopper 54d are also both formed along a cylindrical surface around the rotation center axis AX. This cylindrical surface lies outside that of the first stopper 54a and second stopper 54b.

As shown in FIGS. 4 and 5, an engaging part 45a protruding in the negative Y-direction is disposed on the negative Y-side surface of the top part 45. The engaging part 45a is formed in, for example, a cylindrical or bar shape. The first to fourth stoppers 54a to 54d are disposed around the engaging part 45a. That is, the negative Y-side end of the engaging part 45a is surrounded by the first to fourth stoppers 54a to 54d. When the first to fourth stoppers 54a to 54d contact the engaging part 45a, they restrict the movement of the engaging part 45a and thus restrict the movement of the top part 45. The middle part 44 moves in synchronization with the top part 45. Accordingly, when the movement of the top part 45 is restricted, the movement of the middle part 44 is regulated as well. Accordingly, by regulating the movement of the engaging part 45a, the movement of the moving unit 42 (the middle part 44 and top part 45) can be restricted.

Figure 6:
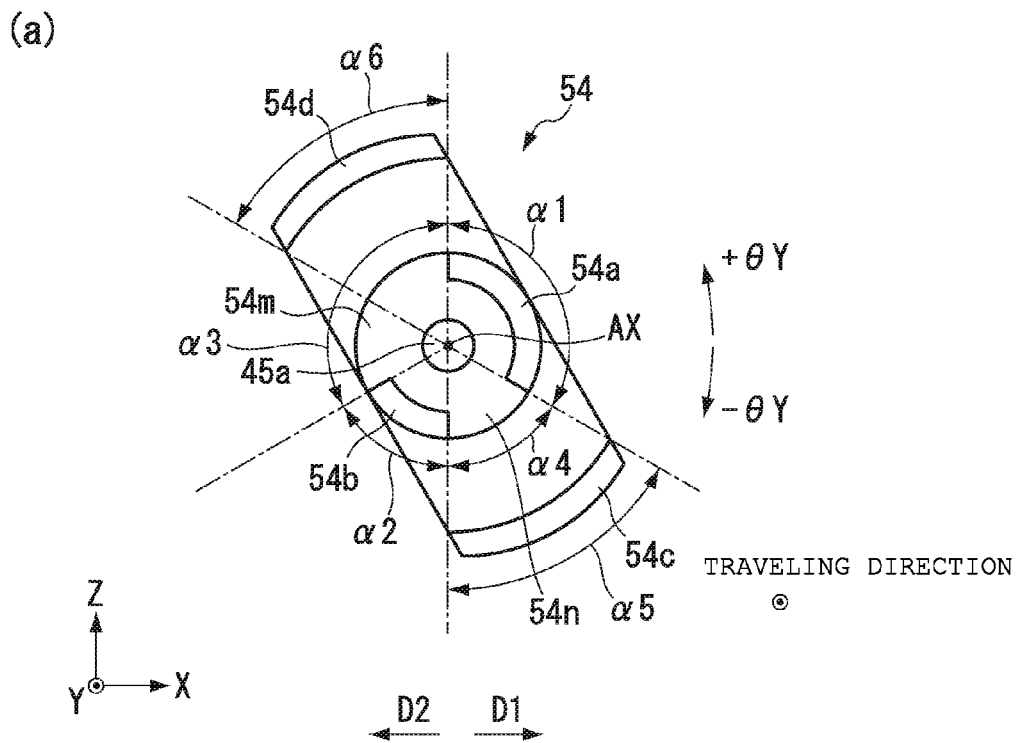
FIG. 6(a) is a diagram showing an example of a rotor.
FIG. 6(b) is a diagram showing an example of an indication unit and a sensor unit.
Figure 6:
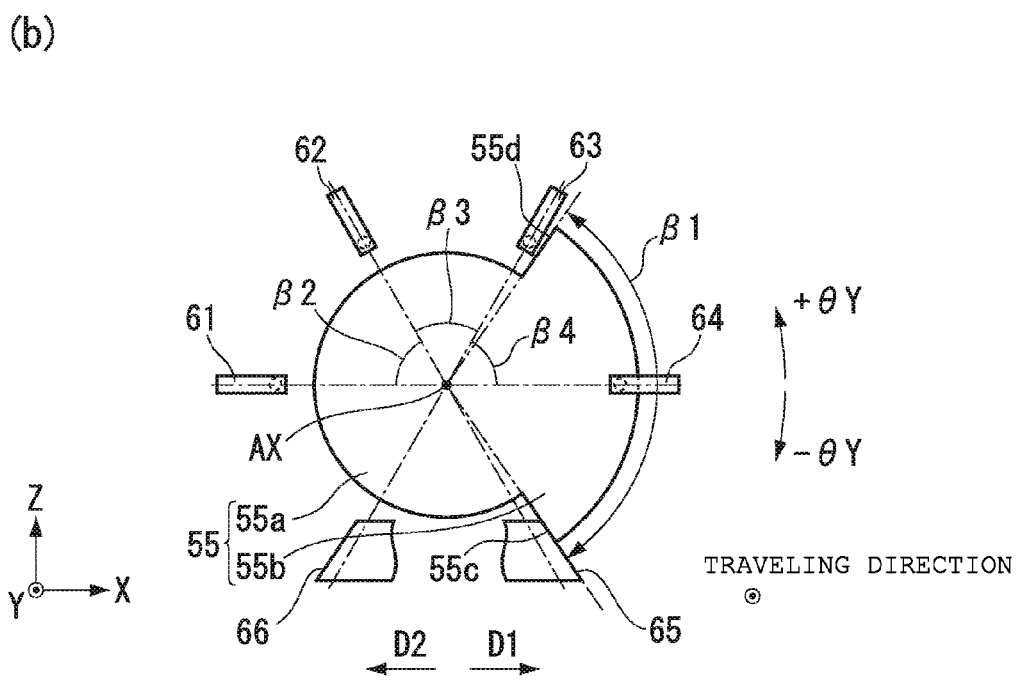

FIG. 6(a) is a diagram showing an example of the rotor 54 when seen in the negative Y-direction. FIG. 6(a) shows the engaging part 45a of the top part 45 along with the rotor 54. With regard to the negative and positive θY-directions around the Y-axis, the clockwise direction seen in the traveling direction (the positive Y-direction) is referred to as a positive θY-direction, and the counterclockwise direction as a negative θY-direction. Since the rotor 54 is seen in a direction opposite to the traveling direction in FIG. 6(a), the positive θY-direction is shown as the counterclockwise direction in the diagram, and the negative θY-direction is shown as the clockwise direction.

As shown in FIG. 6(a), the first stopper 54a is formed over a range of an angle α1 in the θY-direction around the rotation center axis AX. The angle α1 is set to, for example, about 120°, but is not limited thereto. The second stopper 54b is formed over a range of an angle α2 in the θY-direction around the rotation center axis AX. The angle α2 can be set to, for example, about 60°, but is not limited thereto.

The gap 54m is formed from the positive θY-side edge of the first stopper 54a to the negative θY-side edge of the second stopper 54b and in a range of an angle α3 in the θY-direction around the rotation center axis AX. The gap 54n is formed from the negative θY-side edge of the first stopper 54a to the positive θY-side edge of the second stopper 54b and in a range of an angle α4 in the θY-direction around the rotation center axis AX. The angle α3 is set to a larger angle than the angle α4. The angle α4 is set in accordance with the diameter of the engaging part 45a so that the engaging part 45a can pass through the gap 54n. Note that the angle α4 may be set first and then the diameter of the engaging part 45a may be set in accordance with the value of the angle α4. In the present embodiment, the angle α3 and the angle α4 are set to about 120° and about 60°, respectively, but not limited thereto.

The third stopper 54c is formed over a range of an angle α5 in the θY-direction around the rotation center axis AX. The angle α5 is set to, for example, about 60°, but not limited thereto. The third stopper 54c is disposed so as to cover a gap formed on the negative θY-side of the first stopper 54a against the rotation direction of the rotor 54.

The fourth stopper 54d is disposed in a position displaced from the third stopper 54c by 180° around the rotation center axis AX. The fourth stopper 54d is formed over a range of an angle α6 in the θY-direction. The angle α6 s set to, for example, about 60° , but not limited thereto. The fourth stopper 54d is disposed so as to cover a part of a gap formed on the positive θY-side of the first stopper 54a in the rotation direction of the rotor 54.

FIG. 6(b) is a diagram showing an example of the indication unit 55 and the sensor unit 56 when seen in the positive Y-side. As in FIG. 6(a), the clockwise direction seen in the traveling direction (the positive Y-direction) is referred to as the positive θY-direction, and the counter-clockwise direction as the negative θY-direction.

As shown in FIG. 6(b), the indication unit 55 is formed in a disc shape and fixed to the second gear 52b or the rotation shaft 53. The attitude of the indication unit shown in FIG. 6(b) corresponds to the attitude of the rotor 54 shown in FIG. 6(a). That is, when the rotor 54 takes the attitude shown in FIG. 6(a), the indication unit 55 takes the attitude shown in FIG. 6(b). Conversely, when the indication unit 55 takes the attitude shown in FIG. 6(b), the rotor 54 takes the attitude shown in FIG. 6(a). The indication unit 55 rotates integrally with the second gear 52b or rotation shaft 53 in the θY-direction. Along with the indication unit 55, the rotor 54 is fixed to the rotation shaft 53. Accordingly, when the rotation shaft 53 rotates, the indication unit 55 rotates integrally with the rotor 54.

The indication unit 55 is disposed on the negative Y-side with respect to the second gear 52b. The indication unit 55 includes a base 55a and a light-shielding part 55b. The base 55a is a part formed in a circular shape. The light-shielding part 55b is disposed on part of the perimeter of the base 55a and is formed so as to be capable of shielding detection light used by the sensor unit 56. The light-shielding part 55b has, for example, end surfaces 55c, 55d. The end surfaces 55c, 55d are disposed so as to form an angle β1 in the θY-direction around the rotation center axis AX. The angle β1 formed is below 120°, for example, about 116°, but not limited thereto. In the configuration shown in FIG. 6(b), the light-shielding part 55b is disposed on the positive X-side with respect to the base 55a.

The sensor unit 56 includes a first sensor 61, a second sensor 62, a third sensor 63, and a fourth sensor 64. For example, as shown in FIG. 5, the first to fourth sensors 61 to 64 each include a base 56a, a light emitter 56b, and a light receiver 56c. The base 56a is formed in a U-shape and has two parallel ends (a first end 56m and a second end 56n). The light emitter 56b is disposed on the first end 56m and emits inspection light. The light receiver 56c is disposed on the second end 56n. The light emitter 56b is, for example, an LED, and the light receiver 56c is, for example, a photoelectric conversion element, such as a photodiode.

In the present embodiment, the light emitter 56b and light receiver 56c are disposed so as to be opposed to each other. A predetermined gap is formed between the light emitter 56b and light receiver 56c in the Y-direction. Inspection light emitted from the light emitter 56b travels this gap and enters the light receiver 56c. The light receiver 56c photoelectrically converts the received inspection light and outputs a light reception signal (an electrical signal).

The first to fourth sensors 61 to 64 are each disposed in such a manner that the light emitter 56b and light receiver 56c are opposed to each other with the track of the light-shielding part 55b therebetween. When the indication unit 55 rotates, the light-shielding part 55b enters between the light emitter 56b and light receiver 56c depending on the rotation angle. When the light-shielding part 55b enters between the light emitter 56b and light receiver 56c due to the rotation of the indication unit 55, the inspection light is shielded by the light-shielding part 55b. Accordingly, the light receiver 56c does not output a light reception signal. By detecting whether there is a light reception signal, the first to fourth sensors 61 to 64 can detect whether the light-shielding part 55b is present between the light emitter 56b and light receiver 56c.

As shown in FIG. 6(b), the first sensor 61 is disposed on the negative X-side of the rotation center axis AX. The second sensor 62 is spaced from the first sensor 61 by an angle β2 in the negative θY-direction. The third sensor 63 is spaced from the second sensor 62 by an angle β3 in the negative θY-direction. The fourth sensor 64 is spaced from the third sensor 63 by an angle β4 in the negative θY-direction. The angles β2, β3, and β4 are each set to, for example, about 60°. This disposition prevents the light-shielding part 55b from simultaneously overlapping three or more of the first to fourth sensors 61 to 64.

In the present embodiment, the first sensor 61 and third sensor 63 are spaced from each other by 120° in the θY-direction around the rotation center axis AX, and the range of the light-shielding part 55b in the θY-direction is 116°. Accordingly, for example, when the light-shielding part 55b is disposed between the first sensor 61 and third sensor 63, the positive θY-side edge of the light-shielding part 55b and the first sensor 61 are spaced from each other by only about 2° in the θY-direction. Similarly, the negative θY-side edge of the light-shielding part 55b and the third sensor 63 are spaced from each other by only about 2° in the θY-direction. For this reason, when the indication unit 55 rotates by 2° or more in the θY-direction with the light-shielding part 55b between the first sensor 61 and third sensor 63, one of the θY-side edges of the light-shielding part 55b shields the inspection light of the first sensor 61 or that of the third sensor 63. The same applies even when the light-shielding part 55b is disposed between the second sensor 62 and fourth sensor 64.

The mechanical stopper 60 has a stopper surface 65 and a stopper surface 66. The stopper surface 65 contacts the end surface 55c of the light-shielding part 55b. The stopper surface 66 contacts the end surface 55d of the light-shielding part 55b. When the end surfaces 55c, 55d of the light-shielding part 55b contact the stopper surfaces 65, 66, respectively, the rotation of the indication unit 55 in the θY-direction is restricted. In the present embodiment, the indication unit 55 is restricted so as to rotate in a range of 180° between a state in which the end surface 55c is in contact with the stopper surface 65 (a state in which the light-shielding part 55b is disposed on the positive X-side with respect to the base 55a) and a state in which the end surface 55d is in contact with the stopper surface 66 (a state in which the light-shielding part 55b is disposed on the negative X-side with respect to the base 55a).

Next, the operation of the movement regulation unit 43 will be described. FIGS. 7(a) to 7(d) are diagrams showing the operation of the movement regulation unit 43.

Figure 7:
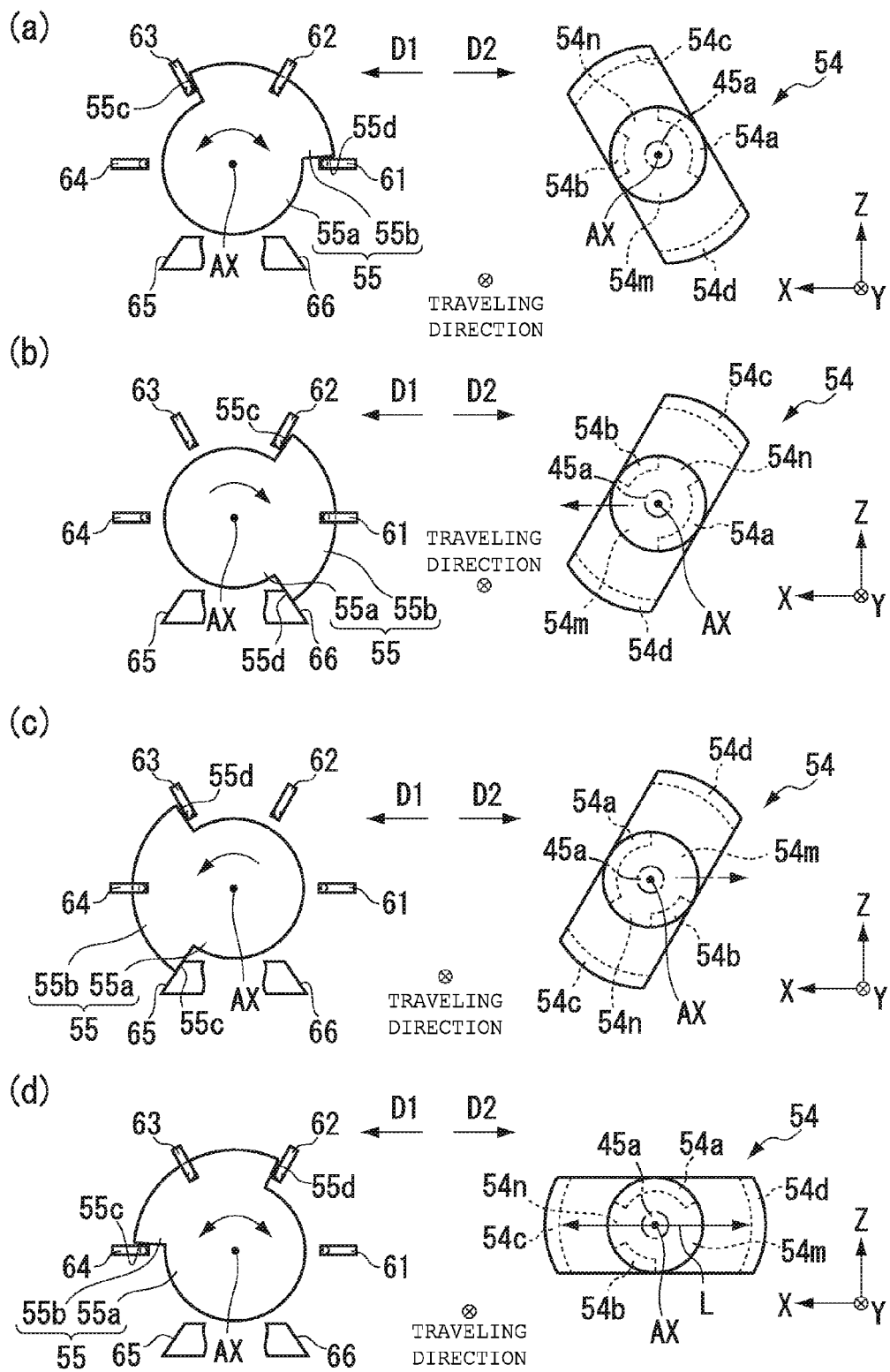
FIGS. 7(a) to 7(d) are diagrams showing the operation of the movement regulation unit.

FIG. 7(a) shows the operation of the movement regulation unit 43 in placing the transfer apparatus 40 in the first state (see FIG. 3 and the like).

As shown in FIG. 7(a), in order to place the moving unit 42 in the first state, the controller 57 adjusts the attitude of the rotor 54 so that the second stopper 54b is disposed on the positive X-side of the engaging part 45a and the first stopper 54a is disposed on the negative X-side of the engaging part 45a. Hereafter this attitude will be referred to as a "first attitude." When the rotor 54 is taking the first attitude, the following occurs: when the moving unit 42 (the top part 45) attempts to move in the positive X-direction, the engaging part 45a contacts the second stopper 54b; when it attempts to move in the negative X-direction, the engaging part 45a contacts the first stopper 54a. Thus, the movement of the engaging part 45a in the X-direction is restricted, and the movement of the moving unit 42 in the X-direction is restricted accordingly. As a result, the moving unit 42 is placed in a state in which it is located in the reference position P1.

When the rotor 54 is taking the first attitude, the light-shielding part 55b of the indication unit 55 is disposed between the first sensor 61 and third sensor 63. In the first sensor 61, third sensor 63, and fourth sensor 64, the light receiver 56c receives inspection light from the light emitter 56b and outputs a light reception signal; in the second sensor 62, inspection light is shielded and therefore no light reception signal is outputted.

As seen above, the controller 57 can set the attitude of the rotor 54 to the first attitude by adjusting the attitude of the indication unit 55 so that the first sensor 61, third sensor 63, and fourth sensor 64 output light reception signals and the second sensor 62 does not output a light reception signal.

At this time, the controller 57 detects the light reception signals of the first to fourth sensors 61 to 64 and rotates the indication unit 55 in the positive θY-direction or negative θY-direction on the basis of the detection result. For example, when the controller 57 detects that the first sensor 61 is shielded from light, the controller 57 rotates the indication unit 55 in the negative θY-direction, and immediately after the first sensor 61 is changed from the light-shielded state to a light receiving state, the controller 57 stops rotating the indication unit 55. Thus, the light-shielding part 55b can be disposed between the first sensor 61 and third sensor 63.

When the controller 57 detects that the fourth sensor 64 is shielded from light, it rotates the indication unit 55 in the positive θY-direction to shield the third sensor 63 from light; when the controller 57 detects that the third sensor 63 is shielded from light, it further rotates the indication unit 55 in the positive θY-direction, as well as detects the output of the third sensor 63; and immediately after the third sensor 63 is changed from the light-shielded state to a light receiving state, the controller 57 stops rotating the indication unit 55. In this case, too, the light-shielding part 55b is disposed between the first sensor 61 and third sensor 63.

Cases in which the moving unit 42 is placed in the second state include a case in which the moving unit 42 is moved to the protruding position P2 in the first direction D1 and a case in which the moving unit 42 is moved to the protruding position P3 in the second direction D2. In the case in which the moving unit 42 is moved to the protruding position P2, the controller 57 adjusts the attitude of the rotor 54 so that the gap 54m is disposed on the positive X-side of the engaging part 45a and the first stopper 54a is disposed on the negative X-side of the engaging part 45a, as shown in FIG. 7(b). Hereafter, this attitude will be referred to as a "second attitude." When the moving unit 42 attempts to move in the positive X-direction with the rotor 54 taking the second attitude, the engaging part 45a passes through the gap 54m. Accordingly, the movement of the engaging part 45a is not restricted, which allows the moving unit 42 to move in the first direction D1. On the other hand, when the moving unit 42 attempts to move in the negative X-direction, the engaging part 45a contacts the first stopper 54a and thus the movement thereof in the negative X-direction is restricted. Thus, for example, when the moving unit 42 attempts to return from the protruding position P2 to the reference position P1, the movement thereof in the negative X-direction beyond the reference position P1 can be restricted.

When the rotor 54 is taking the second attitude, the end surface 55d of the light-shielding part 55b contacts the stopper surface 66, as shown in FIG. 7(b). The light-shielding part 55b is disposed on the positive θY-side of the second sensor 62, and the central portion of the light-shielding part 55b in the θY-direction is disposed so as to correspond to the first sensor 61. In the second sensor 62, third sensor 63 and fourth sensor 64, the light receiver 56c receives inspection light from the light emitter 56b and outputs light reception signal; in the first sensor 61, inspection light is shielded and therefore no light reception signal is outputted.

As seen above, the controller 57 can set the attitude of the rotor 54 to the second attitude by adjusting the attitude of the indication unit 55 so that the second sensor 62, third sensor 63, and fourth sensor 64 output light reception signals and the first sensor 61 does not output a light reception signal.

At this time, the controller 57 detects the light reception signals of the first to fourth sensors 61 to 64 and rotates the indication unit 55 in the positive θY-direction or negative θY-direction on the basis of the detection result. For example, when the controller 57 detects that one of the third sensor 63 and fourth sensor 64 is shielded from light, it rotates the indication unit 55 in the positive θY-direction to shield the second sensor 62 from light; when the controller 57 detects that the second sensor 62 is shielded from light, it further rotates the indication unit 55 in the positive θY-direction, as well as detects the output of the second sensor 62; and immediately after the second sensor 62 is changed from the light-shielded state to a light receiving state, the controller 57 stops rotating the indication unit 55. Thus, the light-shielding part 55b can be disposed on the positive θY-side of the second sensor 62.

In the present embodiment, the stopper surface 66 is provided. Thus, by contacting the end surface 55d of the light-shielding part 55b with the stopper surface 66, the rotation of the indication unit 55 can be restricted. Instead of providing the stopper surface 66 (the mechanical stopper 60), a sensor having the same function as the first to fourth sensors 61 to 64 may be disposed in the position of the stopper surface 66. In this configuration, the controller 57 can control the indication unit 55 so that the rotation of the indication unit 55 is stopped, using the detection result of the sensor.

In the case in which the moving unit 42 is moved to the protruding position P3 in the second direction D2, the controller 57 adjusts the attitude of the rotor 54 so that the first stopper 54a is disposed on the positive X-side of the engaging part 45a and the gap 54m is disposed on the negative X-side of the engaging part 45a, as shown in FIG. 7(c). Hereafter, this attitude will be referred to as a "third attitude." When the moving unit 42 attempts to move in the negative X-direction with the rotor 54 taking the third attitude, the engaging part 45a passes through the gap 54m. Accordingly, the movement of the engaging part 45a is not restricted, which allows the moving unit 42 to move in the second direction D2. On the other hand, when the moving unit 42 attempts to move in the positive X-direction, the engaging part 45a contacts the first stopper 54a and thus the movement thereof in the positive X-direction is restricted. Thus, for example, when the moving unit 42 attempts to return from the protruding position P3 to the reference position P1, the movement thereof in the positive X-direction beyond the reference position P1 can be restricted.

When the rotor 54 is taking the third attitude, the end surface 55c of the light-shielding part 55b is in contact with the stopper surface 65, as shown in FIG. 7(c). The light-shielding part 55b is disposed on the negative θY-side of the third sensor 63, and the central portion of the light-shielding part 55b in the θY-direction is disposed so as to correspond to the fourth sensor 64. In the first sensor 61, second sensor 62, and third sensor 63, the light receiver 56c receives inspection light from the light emitter 56b and outputs a light reception signal; in the fourth sensor 64, inspection light is shielded and therefore no light reception signal is outputted.

As seen above, the controller 57 can set the attitude of the rotor 54 to the third attitude by adjusting the attitude of the indication unit 55 so that the first sensor 61, second sensor 62, and third sensor 63 output light reception signals and the fourth sensor 64 does not output a light reception signal.

At this time, the controller 57 detects the light reception signals of the first to fourth sensors 61 to 64 and rotates the indication unit 55 in the positive θY-direction or negative θY-direction on the basis of the detection result. For example, when the controller 57 detects that one of the first sensor 61 and second sensor 62 is shielded from light, it rotates the indication unit 55 in the negative θY-direction to shield the third sensor 63 from light; when the controller 57 detects that the third sensor 63 is shielded from light, it further rotates the indication unit 55 in the negative θY-direction, as well as detects the output of the third sensor 63; and immediately after the third sensor 63 is changed from the light-shielded state to a light receiving state, the controller 57 stops rotating the indication unit 55. Thus, the light-shielding part 55b can be disposed on the negative θY-side of the third sensor 63.

In the present embodiment, the stopper surface 65 is provided. Thus, by contacting the end surface 55c of the light-shielding part 55b with the stopper surface 65, the rotation of the indication unit 55 can be restricted. Instead of providing the stopper surface 65 (the mechanical stopper 60), a sensor having the same function as the first to fourth sensors 61 to 64 may be disposed in the position of the stopper surface 65. In this configuration, the controller 57 can control the indication unit 55 so that the rotation of the indication unit 55 is stopped, using the detection result of the sensor.

In placing the moving unit 42 in the third state, the controller 57 adjusts the attitude of the rotor 54 so that the gap 54n is disposed on the positive X-side of the engaging part 45a; the third stopper 54c is disposed on the positive X-side of the gap 54n; the gap 54m is disposed on the negative X-side of the engaging part 45a; and the fourth stopper 54d is disposed on the negative X-side of the gap 54m, as shown in FIG. 7(d). Hereafter, this attitude will be referred to as a "fourth attitude." When the moving unit 42 attempts to move in the positive X-direction with the rotor 54 taking the fourth attitude, the engaging part 45a passes through the gap 54n. However, when the moving unit 42 further attempts to move in the positive X-direction, the engaging part 45a contacts the third stopper 54c. As seen above, the engaging part 45a is allowed to move in the positive X-direction in a predetermined range L from the gap 54n to the third stopper 54c. Similarly, when the moving unit 42 attempts to move in the negative X-direction, the engaging part 45a passes through the gap 54m, and when the moving unit 42 further attempts to move in the negative X-direction, the engaging part 45a contacts the fourth stopper 54d. As seen above, the engaging part 45a is allowed to move in the negative X-direction in a predetermined range from the gap 54m to the fourth stopper 54d. Thus, the moving unit 42 is allowed to move in the X-direction in a range from the third stopper 54c to the fourth stopper 54d, and further movement thereof in the X-direction is restricted.

When the rotor 54 is taking the fourth attitude, the light-shielding part 55b of the indication unit 55 is disposed between the second sensor 62 and fourth sensor 64. In the first sensor 61, second sensor 62, and fourth sensor 64, the light receiver 56c receives inspection light from the light emitter 56b and outputs a light reception signal; in the third sensor 63, inspection light is shielded and therefore no light reception signal is outputted.

As seen above, the controller 57 can set the attitude of the rotor 54 to the fourth attitude by adjusting the attitude of the indication unit 55 so that the first sensor 61, second sensor 62, and fourth sensor 64 output light reception signals and the third sensor 63 does not output a light reception signal.

At this time, the controller 57 detects the light reception signals of the first to fourth sensors 61 to 64 and rotates the indication unit 55 in the positive θY-direction or negative θY-direction on the basis of the detection result. For example, when the controller 57 detects that the first sensor 61 is shielded from light, it rotates the indication unit 55 in the negative θY-direction to shield the second sensor 62 from light; when the controller 57 detects that the second sensor 62 is shielded from light, it further rotates the indication unit 55 in the negative θY-direction, as well as detects the output of the second sensor 62; and immediately after the second sensor 62 is changed from the light-shielded state to a light receiving state, the controller 57 stops rotating the indication unit 55. Thus, the light-shielding part 55b can be disposed between the second sensor 62 and fourth sensor 64.

For example, when the controller 57 detects that the fourth sensor 64 is shielded from light, it further rotates the indication unit 55 in the positive θY-direction, as well as detects the output of the fourth sensor 64; and immediately after the fourth sensor 64 is changed from the light-shielded state to a light receiving state, the controller 57 stops rotating the indication unit 55. In this case, too, the light-shielding part 55b can be disposed between the second sensor 62 and fourth sensor 64.

As seen above, according to the present embodiment, the movement regulation unit 43 can switch between the first state, in which the moving unit 42 is restricted in the reference position P1, and the second state, in which the moving unit 42 is allowed to move from the reference position P1 to one of the first and second directions D1 and D2 and in which the movement thereof in other direction is restricted. Thus, in a case in which the moving unit 42 is moved in the first direction D1 and then moved in the second direction D2 to return it to the reference position P1, the movement regulation unit 43 prevents the moving unit 42 rushing out in the second direction D2. As a result, inadvertent rush-out of the moving unit 42 is reliably prevented.

While the embodiment has been described above, the present invention is not limited thereto. Various changes can be made to the embodiment without departing from the spirit and scope of the invention. While, in the above embodiment, the attitude of the rotor 54 is detected using the four sensors (the first to fourth sensors 61 to 64) forming the sensor unit 56 and the indication unit 55, other configurations may be employed. For example, some of the first to fourth sensors 61 to 64 forming the sensor 56 may be omitted, or the same sensor may be additionally disposed. Further, a configuration may be employed in which rotation information of the rotation shaft 53 is detected using another sensor, such as a rotary encoder, and the rotation of the rotation shaft 53 is adjusted on the basis of the detection result.

While, in the embodiment, the controller 57 controls the rotation of the drive source 51 on the basis of the detection result of the sensor 56, other configurations may be employed. For example, a main controller that centrally controls rails 10, a ceiling travelling vehicle 20, and a transfer apparatus 40 may perform this operation. In this case, when a detection failure occurs in any of the first to fourth sensors 61 to 64 in the embodiment, the main controller may stop the operation of the elements, and the controller 57 may stop the operation of the drive source 51.

While, in the embodiment, the belt mechanism 30 is used as an element for moving the moving unit 42, other configurations may be employed. For example, other drive systems such as a gear mechanism may be used.

DESCRIPTION OF REFERENCE SIGNS

D1 . . . first direction D2 . . . second direction FP . . . article L . . . predetermined range P1 . . . reference position P2, P3 . . . protruding position AX . . . rotation center axis 1 . . . processing chamber 10 . . . rail 20 . . . ceiling travelling vehicle 30 . . . belt mechanism 40 . . . transfer apparatus 41 . . . base (main body) 42 . . . moving unit 43 . . . transfer regulation unit 44 . . . middle part 45 . . . top part 45a . . . engaging part 47 . . . ascent/descent drive unit 48 . . . platform 48a . . . belt 49 . . . gripper 54 . . . rotor 54a . . . first stopper (stopper) 54b . . . second stopper (stopper) 54c . . . third stopper (outer stopper) 54d . . . fourth stopper (outer stopper) 54m. 54n . . . gap 55 . . . indication unit 55b . . . light-shielding part 56 . . . sensor 57 . . . controller 61 . . . first sensor 62 . . . second sensor 63 . . . third sensor 64 . . . fourth sensor

The invention claimed is:

1. A transfer apparatus that comprises a moving unit capable of moving with respect to a main body and transferring an article with the moving unit protruding from the main body, the transfer apparatus comprising
a movement regulation unit configured to be capable of switching between a first state in which the moving unit is restricted in a reference position and a second state in which the moving unit is allowed to move from the reference position to one of a first direction and a second direction opposite to the first direction and in which movement of the moving unit in the other direction is restricted,
wherein the movement regulation unit comprises a rotor comprising a stopper, the stopper being configured to contact an engaging part in a moving direction of the engaging part, the engaging part being disposed on the moving unit, and
the movement regulation unit switches between at least the first state and the second state on the basis of a rotation position of the rotor.

2. The transfer apparatus of claim 1, wherein the movement regulation unit is formed so as to be capable of switching among the first state and the second state, as well as a third state in which the moving unit is allowed to move in the first direction and the second direction only in a predetermined range.

3. The transfer apparatus of claim 1, wherein the rotor comprises an outer stopper disposed outside the stopper and configured to allow the engaging part to move only in a predetermined range.

4. The transfer apparatus of claim 1, wherein the movement regulation unit comprises an indication unit configured to rotate with rotation of the rotor, a sensor unit configured to detect the indication unit, and a controller configured to control the rotation position of the rotor on the basis of a detection result from the sensor unit.

5. The transfer apparatus of claim 4, wherein
the sensor unit comprises a plurality of sensor units disposed along a rotation direction of the indication unit; and the controller controls the rotation position of the rotor on the basis of detection results from the sensor units.

6. The transfer apparatus of claim 1, wherein
the main body is connected to a ceiling traveling vehicle, and
the moving unit comprises a gripper capable of holding an article and an ascent/descent drive unit configured to raise and lower the gripper.

7. The transfer apparatus of claim 6, wherein the first direction and the second direction are directions crossing a traveling direction of the ceiling traveling vehicle, of horizontal directions.

8. A method for controlling a transfer apparatus, the transfer apparatus comprising a moving unit capable of moving with respect to a main body and configured to transfer an article with the moving unit protruding from the main body, the method comprising
switching, by a movement regulation unit, between a first state in which the moving unit is restricted in a reference position and a second state in which the moving unit is allowed to move from the reference position to one of a first direction and a second direction opposite to the first direction and in which movement of the moving unit in the other direction is restricted,
wherein the movement regulation unit comprises a rotor comprising a stopper, the stopper being configured to contact an engaging part in a moving direction of the engaging part, the engaging part being disposed on the moving unit, and
the movement regulation unit switches between at least the first state and the second state on the basis of a rotation position of the rotor.

* * * * *